(12) United States Patent
Tien et al.

(10) Patent No.: US 10,696,543 B1
(45) Date of Patent: Jun. 30, 2020

(54) WATERPROOF MEMS CHIP PACKAGE STRUCTURE

(71) Applicant: LINGSEN PRECISION INDUSTRIES, LTD., Taichung (TW)

(72) Inventors: Chiung-Yueh Tien, Taichung (TW); Ming-Te Tu, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

(21) Appl. No.: 16/415,491

(22) Filed: May 17, 2019

(30) Foreign Application Priority Data

Apr. 10, 2019 (TW) .............................. 108112495 A

(51) Int. Cl.
*H01L 29/84* (2006.01)
*B81B 7/00* (2006.01)

(52) U.S. Cl.
CPC ...... *B81B 7/0038* (2013.01); *B81B 2207/095* (2013.01)

(58) Field of Classification Search
CPC ..... H01L 29/84; H01L 29/86; H01L 41/1134; H01L 41/1136; H01L 41/1138; H01L 2924/1461
See application file for complete search history.

(56) References Cited

U.S. PATENT DOCUMENTS 9,215,519 B2 * 12/2015 Goida ................. H04R 31/006
2020/0045476 A1 * 2/2020 Wang ..................... H01L 24/48

* cited by examiner

*Primary Examiner* — Cuong Q Nguyen

(74) *Attorney, Agent, or Firm* — Muncy, Geissler, Olds & Lowe, P.C.

(57) ABSTRACT

A waterproof MEMS chip package structure includes a substrate having aa through hole cut through opposing top and bottom surface thereof, a waterproof membrane disposed in the through hole, an along chip bonded to the top surface of the substrate, a MEMS chip stacked on the analog chip and electrically connected to the substrate and the analog chip by wire bonding, and a top cover mounted on the substrate to form an accommodation chamber that accommodates the analog chip and the MEMS chip and communicates with the outside through the through hole. Therefore, the MEMS chip package structure of the present invention utilizes the waterproof membrane to block water vapor from entering the accommodation chamber through the through hole, thereby achieving the effect of protecting the chips.

5 Claims, 1 Drawing Sheet

US 10,696,543 B1

WATERPROOF MEMS CHIP PACKAGE STRUCTURE

BACKGROUND OF THE INVENTION

1. Field of the Invention

The present invention relates to MEMS (Micro Electro Mechanical System) packaging technology and more particularly, to a waterproof MEMS chip package structure.

2. Description of the Related Art

Today's MEMS chip package structured mainly use a layer of protective colloid to coat the chips placed in the chamber, so that the chips can resist the interference of moisture, dust or other environmental factors entering the chamber from the outside. However, this approach will make the packaging process more complicated.

SUMMARY OF THE INVENTION

The present invention has been accomplished under the circumstances in view. It is the main object of the present invention to provide a waterproof MEMS chip package structure, which has a waterproof effect to improve the service life of the product and which simplifies the packaging process.

To achieve this and other objects of the present invention, a waterproof MEMS chip package structure comprises a substrate, a waterproof membrane, an analog chip, a MEMS chip and a top cover. The substrate comprises a top surface, a bottom surface, and a through hole cut through the top surface and the bottom surface. The waterproof membrane is disposed in the through hole of the substrate. The analog chip is bonded to the top surface of the substrate. The MEMS chip is stacked on the analog chip and electrically connected to the substrate and the analog chip. The top cover is mounted on the top surface of the substrate and defines with the top surface of the substrate an accommodation chamber therebetween for accommodating the analog chip and the MEMS chip. The accommodation chamber communicates with the outside through the through hole.

It can be seen from the above that the MEMS chip package structure of the present invention utilizes the waterproof membrane to effectively prevent external moisture from entering the accommodation chamber through the through hole, thereby providing a waterproof effect and protecting the chips and prolonging the service life of the package structure.

Preferably, the substrate is a multilayer board formed by a plurality of sheets. The waterproof membrane is clamped between two adjacent sheets of the substrate. The material of the waterproof membrane is a polymer, for example, polytetrafluoroethene (PTFE). Further, the material of the top cover can be plastic or metal.

Other advantages and features of the present invention will be fully understood by reference to the following specification in junction with the accompanying drawings, in which like reference signs denote like components of structure.

DETAILED DESCRIPTION OF THE INVENTION

Figure 1:
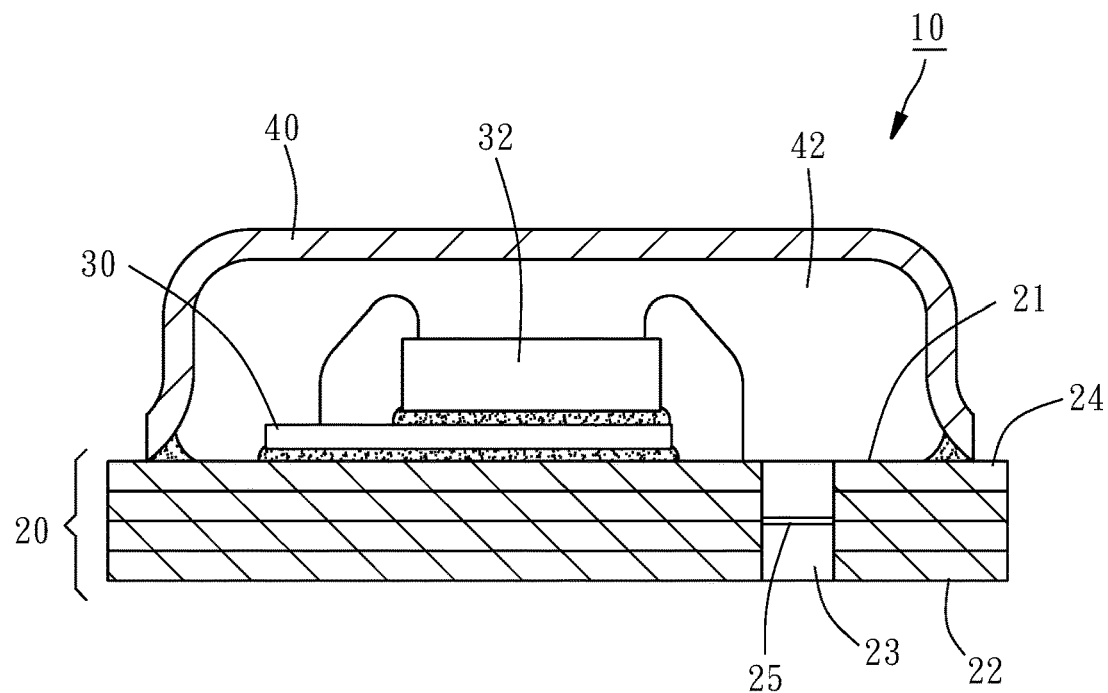
FIG. 1 is a schematic drawing illustrating the structural arrangement of a waterproof MEMS chip package structure in accordance with the present invention.
Figure 2:
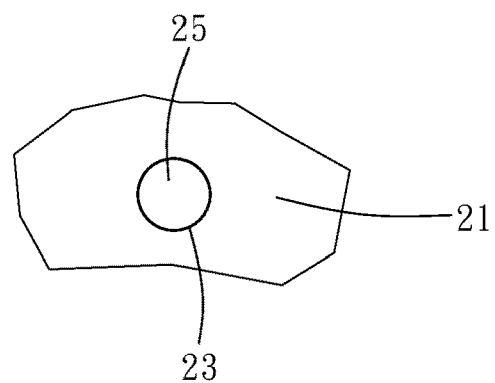
FIG. 2 is a top view of a part of the substrate for waterproof MEMS chip package structure in accordance with the present invention.

The applicant first describes here, throughout the specification, including the preferred embodiment described below and the claims of the scope of the present patent application, the nouns relating to directionality are based on the direction in the drawings. In the following preferred embodiment, the same reference numerals are given to the same or similar elements or structural features thereof, and the dimensions and proportions of the various elements in the drawings are used to facilitate the display and description of the structural features of the present invention but not drawn according to the actual configuration.

Referring to FIG. 1, a waterproof MEMS chip package structure 10 in accordance with the present invention is shown. The waterproof MEMS chip package structure 10 comprises a substrate 20, a waterproof membrane 25, an analog chip 30, a MEMS chip 32 and a top cover 40.

The substrate 20 has a top surface 21, a bottom surface 22 and a through hole 23 cut through the top surface 21 and the bottom surface 22. In this embodiment, the substrate 20 is a multi-layer board formed by a plurality of sheets 24 subjected to a pressing process.

The material of the waterproof membrane 25 in this embodiment is a polymer such as polytetrafluoroethene (PTFE).

The waterproof membrane 25 is disposed in the through hole 23 and is simultaneously clamped between the upper and lower adjacent sheets 24 in the pressing process of the substrate 20 to block water vapor from passing through the through hole 23.

The analog chip 30 is fixed on the top surface 21 of the substrate 20 by an adhesive. The MEMS chip 32 is fixed on a top surface of the analog chip 30 by an adhesive and electrically connected to the substrate 20 and the analog chip 30 by wire bonding. Thereby, the continuity analog signal (such as light, pressure or sound, etc.) transmitted by the MEMS chip 32 is processed by the analog chip 30 for output.

The material of the top cover 40 can be plastic or metal, which is not limited here. The top cover 40 is fixed on the top surface 21 of the substrate 20 by an adhesive and forms an accommodation chamber 42 for accommodating the analog chip 30 and the MEMS chip 32, and the accommodation chamber 42 communicates with the outside through the through hole 23.

It can be seen from the above that the MEMS chip package structure 10 of the present invention can effectively prevent moisture and dust from entering the accommodation chamber 42 through the through hole 23 by using the waterproof membrane 24, thus, a waterproof and dustproof effect is provided to protect the chips located in the accommodation chamber 42 to prolongs the service life of the package structure.

What is claimed is:

1. A MEMS chip package structure, comprising:
   a substrate comprising a top surface, a bottom surface and a through hole cut through said top surface and said bottom surface;
   a waterproof membrane disposed in said through hole of said substrate;
   an analog chip bonded to said top surface of said substrate;
   a MEMS chip stacked on said analog chip and electrically connected to said substrate and said analog chip; and a top cover mounted on said top surface of said substrate and defining with said top surface of said substrate an accommodation chamber therebetween for accommodating said analog chip and said MEMS chip, said accommodation chamber communicating with the outside through said through hole.

2. The MEMS chip package structure as claimed in claim 1, wherein said substrate is a multilayer board formed by a plurality of sheets; said waterproof membrane is clamped between two adjacent said sheets.

3. The MEMS chip package structure as claimed in claim 1, wherein the material of said waterproof membrane is a polymer.

4. The MEMS chip package structure as claimed in claim 3, wherein said polymer is polytetrafluoroethene (PTFE).

5. The MEMS chip package structure as claimed in claim 1, wherein said top cover is selectively made of plastic or metal.

\* \* \* \* \*